United States Patent
Cruz et al.

(10) Patent No.: US 6,597,593 B1
(45) Date of Patent: Jul. 22, 2003

(54) POWERING IC CHIPS USING AC SIGNALS

(75) Inventors: José M. Cruz, Palo Alto, CA (US); Robert J. Bosnyak, San Jose, CA (US); Shwetabh Verma, Menlo Park, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/614,664

(22) Filed: Jul. 12, 2000

(51) Int. Cl.$^7$ .............................. H02M 1/00; H01F 5/00

(52) U.S. Cl. ...................................... 363/147; 336/200

(58) Field of Search .............................. 363/147, 141, 363/144, 146, 21, 97, 20; 257/777, 778, 783; 336/212, 200

(56) References Cited

U.S. PATENT DOCUMENTS

| | | | | |
|---|---|---|---|---|
| 3,564,390 A | * | 2/1971 | Stratton | 363/159 |
| 5,147,815 A | * | 9/1992 | Casto | 437/51 |
| 5,353,001 A | * | 10/1994 | Meinel et al. | 336/83 |
| 5,355,301 A | * | 10/1994 | Saito et al. | 363/147 |
| 5,407,354 A | * | 4/1995 | Fife | 433/116 |
| 5,508,565 A | * | 4/1996 | Hatakeyama et al. | 257/777 |
| 5,570,279 A | * | 10/1996 | Venkataramanan | 363/127 |
| 5,877,667 A | | 3/1999 | Wollesen | |
| 5,933,332 A | * | 8/1999 | Honma | 363/20 |
| 5,986,912 A | * | 11/1999 | Hsiao et al. | 363/147 |
| 6,021,499 A | | 2/2000 | Aleshi | |
| 6,052,790 A | * | 4/2000 | Brown | 363/26 |
| 6,124,778 A | | 9/2000 | Rowley et al. | |
| 6,147,583 A | * | 11/2000 | Rinne et al. | 336/200 |

FOREIGN PATENT DOCUMENTS

EP     0 884 783 A2    12/1998

OTHER PUBLICATIONS

Mohan et al., "Modeling and characterization of On–Chip Transformers", IEEE International Electron Devices Meeting (IEDM), San Francisco, California (Dec. 6–9, 1998) (printed from http://www–smirc.stanford.edu/papers/IEDM98p–mohan.pdf on Nov. 27, 2002).

Richardson Electronics, "2450 MHz: 30, 20, 15 & 8 kW Industrial", catalog page. No date.

Roberts, G., "CMOS Components & Building Blocks", McGill University, slides 29–32 (Sep. 7, 1998) (printed from http://www.macs.ece.mcgill.ca/~roberts/ROBERTS/COURSES/AnaloglCCourse/IC_Components_Ccts_HTML, sld029.htm to sld032.htm on Nov. 27, 2002).

(List continued on next page.)

Primary Examiner—Rajnikant B. Patel
(74) Attorney, Agent, or Firm—Townsend and Townsend and Crew

(57) ABSTRACT

A power converter within an integrated circuit ("IC") for providing DC power to one or more function circuit, where the power converter has a transformer circuit for receiving an AC power signal and for supplying a transformed AC power signal. A converter circuit receives the transformed AC power signal and then converts the signal into a DC power signal supplied to one or more function circuit. The transformed AC power signal might either be stepped up or stepped down. The transformer circuit might comprise two coils, where a first coil is magnetically coupled to a second coil. The first coil is a first spiral and the second coil is a second spiral wherein an insulating material layer is disposed between the first spiral and the second spiral. The transformer circuit might include transformers connected in parallel or in series and may further be connected correspondingly to more than one converter circuit coupled in parallel. An IC comprising the power converter circuit can be integrated into a computer system.

12 Claims, 11 Drawing Sheets

OTHER PUBLICATIONS

Mino M. et al. "planar Microtransformer with Monolithically–Integrated rectifier Diodes for Micro Switching Converters" IEEE Transaction on Magnetics, IEEE inc. New York US, vol. 32, No. 2, Mar. 1, 1996.*

Matsumoto, S. et al., "Integration of a Power Supply for System–on–Chip" IEICE Transactions on Fundamentals of Electronics, Communications and Computer Information and Comm. Eng. Tokyo, JP, vol. E80–A, No. 2, Feb. 1, 1997, pp. 276–282.

Mino, M. et al., "Planar Microtransformer With Monolithically–Integrated Rectifier Diodes For Micro–Switching Converters" IEEE Transaction on Magnetics, IEEE Inc. New York, US, vol. 32, No. 2, Mar. 1, 1996, pp. 291–296.

Mizuguchi, K. et al,. "An On–Board–Type Micro–Switching Converter with MHz Band–Operation" IEEE Translation Journal on Magnetics in Japan, IEEE Inc, New York, US, vol. 9, No. 2, Mar. 1, 1994, pp. 174–178.

* cited by examiner

POWERING IC CHIPS USING AC SIGNALS

BACKGROUND OF THE INVENTION

The present invention relates in general to powering integrated circuits, and in particular, to powering DC ("direct current") powered integrated circuits within an integrated circuit using an AC ("alternating current") power source.

Providing power to complex integrated circuits in high-speed applications presents a common design problem. With advances in design and manufacture of semiconductor devices, it has become possible to integrate larger amounts of circuitry within an integrated circuit ("IC") to enhance overall device functionality. As more circuitry is integrated, there is a corresponding increase in the basic building blocks (i.e., transistors) of the IC. To accommodate the increased number of transistors within an IC, and to provide for faster operation, the transistors are increasingly scaled to smaller dimensions. As transistor size continues to shrink, especially in the field of CMOS technology, power supply voltage levels for CMOS IC devices decrease. Decreasing voltage levels and increasing power demands both cause supply current increases for proper device operation.

Lower supply voltages are required for smaller scaled CMOS devices because as the device dimensions shrink, the gate oxide layer below the gate of a CMOS device is made thinner, which is more susceptible to breakdown when a given gate voltage is applied. Thus, the maximum supply voltage that can be used to power an IC is limited by the breakdown voltage. For example, integrated circuits typically operate at 3.3 Vdc or less, with newer designs approaching supply voltages of 1.0 Vdc.

The power consumed by integrated circuitry increases as a function of both the number of transistors and the switching speed (i.e., clock frequency) associated with a given IC. The power consumed by CMOS ICs is primarily due to charging and discharging circuit node capacitances and can be expressed by the proportion P α nf, where n is the number of transistors per chip and f is the clock frequency. Therefore, as power consumption increases, the supply current requirements for proper operation also increase.

Although the supply voltages might be reduced in newer designs, a much larger nf factor contributes to the overall increase in consumed power. For example, a 2.5 GHz IC design that once might have called for a supply voltage of 3.0 Vdc and have three million transistors might now call for a supply voltage of 1.0 Vdc and have ten million transistors due to additional functionality added to the IC design. Adding functionality from generation to generation is typical in the IC design industry, especially in the microprocessor business. Because power is proportional to nf, a design that once required 30 watts now requires 100 watts. With the supply voltage going from 3.0 Vdc to 1.0 Vdc, the current requirement go from 10 A to 100 A.

A common approach to supplying large currents to an IC is to use a large number of power pin connections, or bond wires, to the integrated circuitry. FIG. 1 illustrates this with an IC 104 mounted on a carrier 102. IC 104 has a plurality of die pads 110 for receiving power and input/output ("I/O") signals from the external environment, with a large number of the die pads reserved for VDD 106 and Ground 108, thus greatly reducing the number of pins available for signal I/O in a pin-limited form factor and unnecessarily increases chip area to accommodate the total number of power pins, making electronic packaging of such a device complicated and expensive.

As shown in FIG. 2, the bond wires (204, 206) which provide external connection (for power or I/O) to an IC 202 can be modeled with parasitic capacitances, parasitic inductances, and parasitic resistances. The above-described parallel power pin approach does reduce the overall parasitic inductance and resistance somewhat, but with large supply current requirements, such as 100 A, even a small overall resistance, such as 1 milliohm, or a small overall inductance, such as 100 fH, on the bonding wires can cause significant voltage drops across the power pin connections. At lower supply voltages, these voltage drops and voltage swings significantly affect device operation and may result in device malfunction.

One measure of effective pin use in the design of semiconductor devices or packaged ICs is the signal-to-power pin ratio ("pin ratio"). The pin ratio of a packaged IC is defined as the number of available signal I/O pins divided by the total number of pins. Generally, if more signal I/O pins are available, the more complex functions the device can perform. It is therefore favorable to maximize the pin ratio for a given device, since the cost of using more pins to power the device is the loss of available signal I/O pins as well as reduced device functionality.

The approximate number of power pins required for a device operating at a given supply voltage and consuming a given amount of power can be estimated using Equation 1 where VDD is the supply voltage, in volts, and P is the power required, in watts.

$$\# \ Power \ pins \ \alpha \frac{P}{VDD^2} \qquad \text{(Equation 1)}$$

As an illustration, a device consuming 30 W at a VDD of 3.0 Vdc only requires about 10 power pins for proper operation. If the device has 400 pins, the pin ratio is quite high (390/400=0.98). However, another 400-pin device operating with a VDD of 1.0 Vdc and at 100 W requires about 300 power pins, resulting in a pin ratio of only 0.25.

Therefore, there is a need in the art for an inventive circuit and method for supplying integrated circuits with power and current requirements while preserving a high pin ratio for semiconductor devices or ICs.

SUMMARY OF THE INVENTION

An inventive power converter within an integrated circuit ("IC") provides DC power to one or more function circuits where the DC power is derived from an applied external AC power signal conveyed into the IC. In a preferred embodiment, the power converter includes a transformer circuit for receiving and transforming the external AC power signal, and a converter circuit for receiving the transformed AC power signal from the transformer circuit and converting it into a DC power signal. The DC power signal then can be used to power the many circuits within the IC.

DESCRIPTION OF THE SPECIFIC EMBODIMENTS

The following detailed description of specific embodiments, including preferred embodiments, reference the accompanying drawings that form part of this disclosure. The drawings illustrate examples of the embodiments and how to practice the invention. Without departing from the scope of the present invention, other embodiments may be used in place of those shown and described, and such substitutions should be apparent to one of ordinary skill in the art upon reading this disclosure.

In a specific embodiment, an AC ("alternating current") power signal is applied to an IC where the IC is an interconnected array of active and passive elements integrated on one or more semiconductor substrates. The IC in the present invention further includes a power converter circuit in which the AC power signal is transformed and converted into a DC ("direct current") power signal that is used to power the IC's "function" circuits. The term "function circuits" refers to those circuits on the IC that use the power provided by the power converter circuit, such as processor circuits, memory circuits, data buffers, etc.

In one embodiment, the IC is without electronic packaging. For example, the IC resides on a printed circuit board, a chip carrier or an equivalent structure. In another embodiment, the IC is encapsulated in a conventional IC package. The package housing the IC includes a plurality of electrically conductive paths for conveying power and signals between the integrated circuit elements and points external to the package. The external terminus of these paths are typically pins, such as power and signal pins, that extend from the package's exterior or are conductive contacts flush with the package surface, at which an external electrical connection to the package can be made for conveying the power and signals to the IC.

Figure 1:
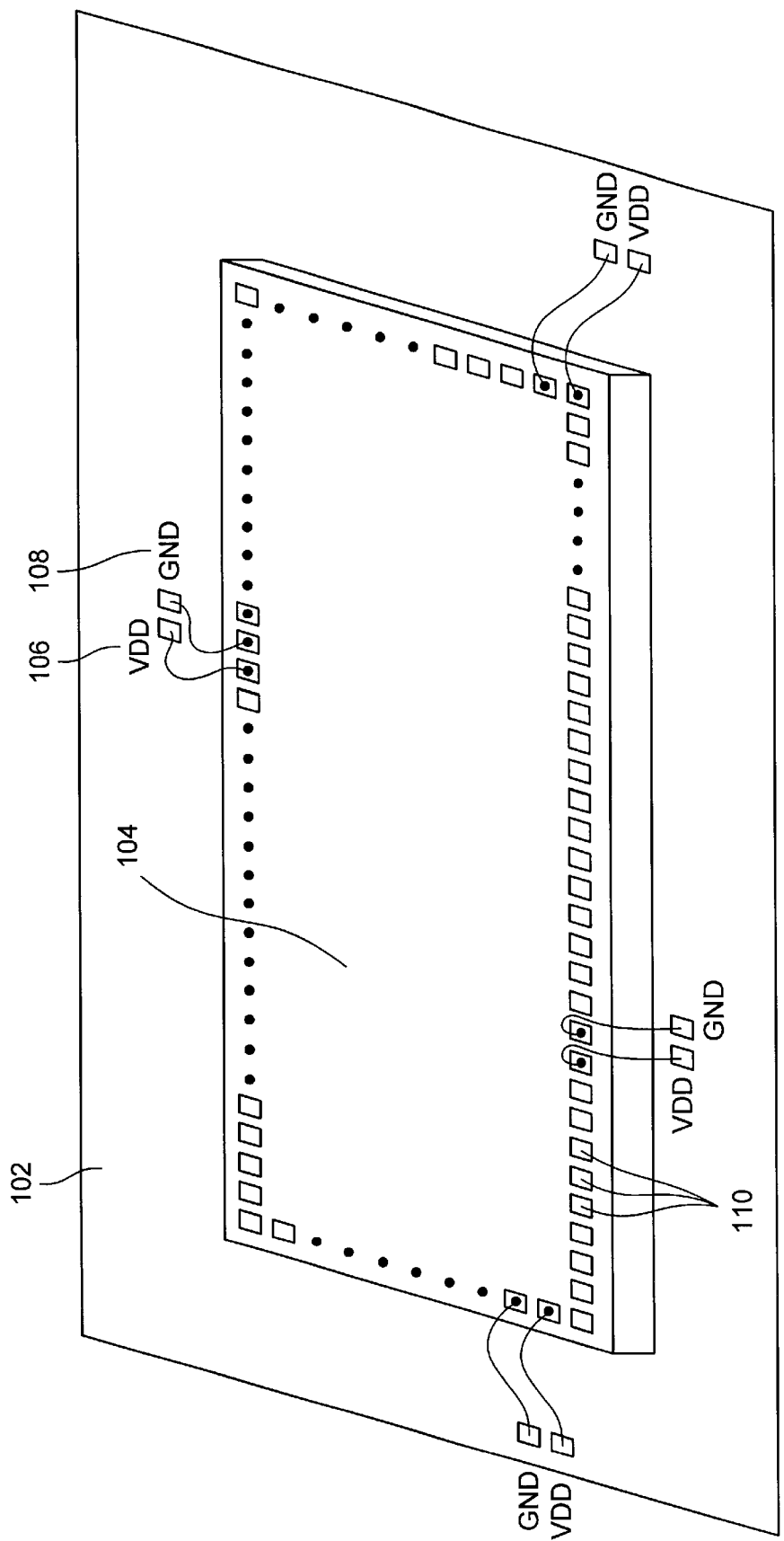
FIG. 1 is a schematic diagram of an IC, as related background art.
Figure 2:
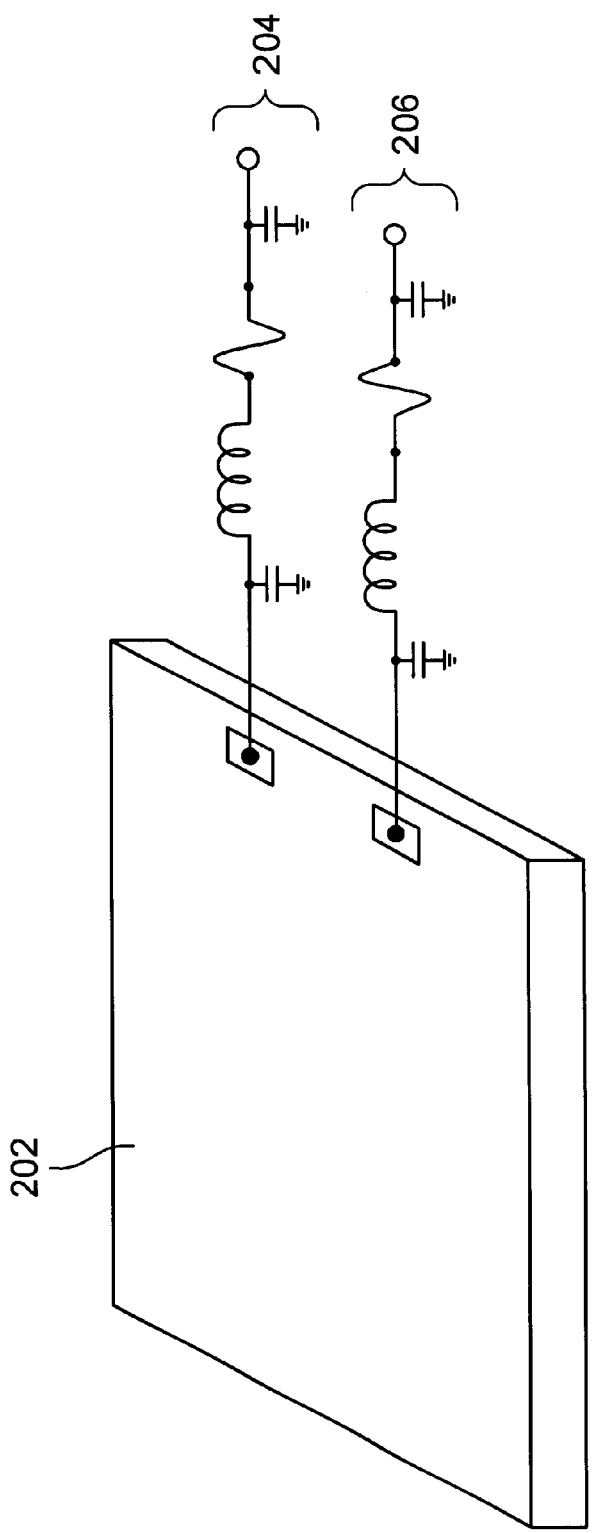
FIG. 2 is a schematic diagram of an electrical model for bond wires connected to an IC, as related background art.
Figure 3:
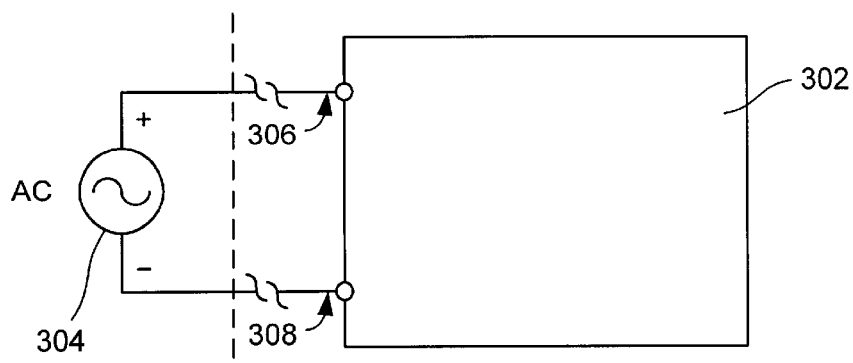
FIG. 3 is a block diagram for an IC powered by an AC power signal.
Figure 4:
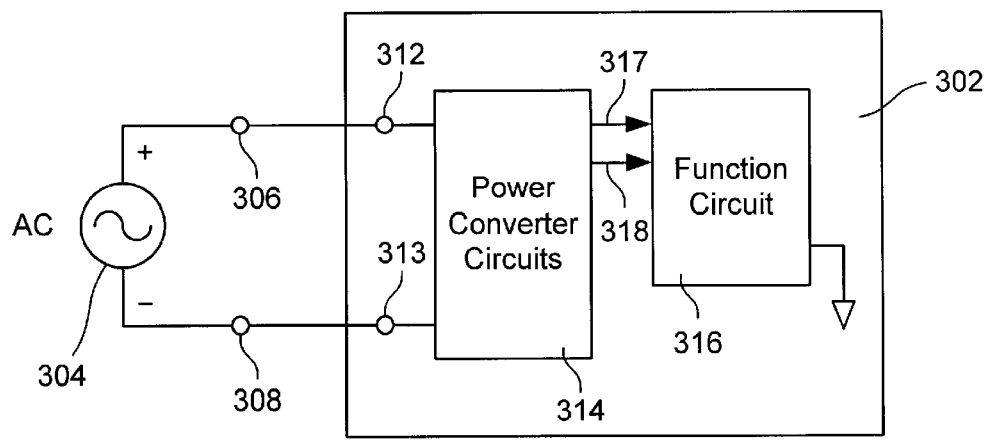
FIG. 4 is a block diagram of a power converter circuit connected to integrated function circuits within an IC.
Figure 5:
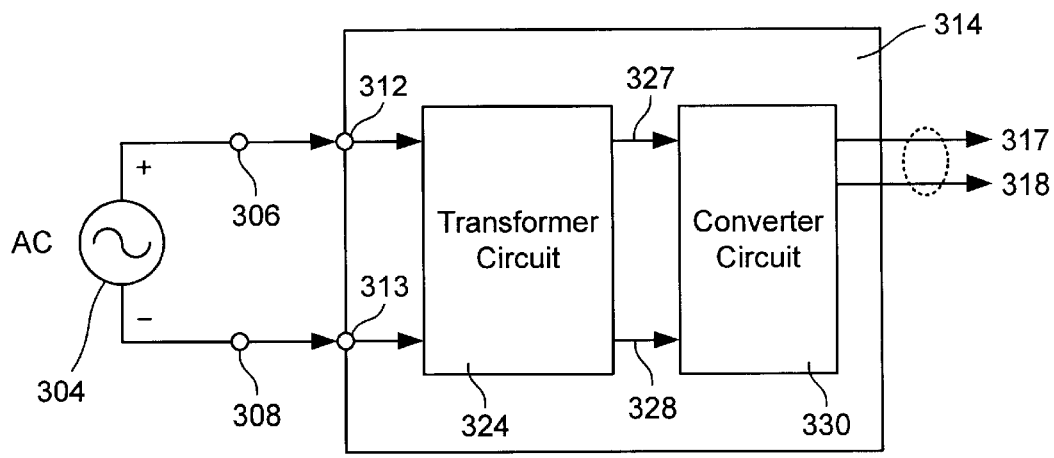
FIG. 5 is a block diagram of an exemplary power converter circuit.

A variety of configurations is suitable for the packaged IC 302 shown in FIGS. 3, 4 and 5. In some configurations, power converter circuit 314 and one or more function circuit 316 are on the same die. In other configurations, power converter circuit 314 and one or more function circuit 316 are on separate dies. Some suitable configurations include a dual inline package (DIP), a leadless ceramic chip carrier (LCCC), a plastic quad flat package (PQFP), a pin grid array (PGA), a pad array carrier (PAC), a ball grid array (BGA), a single in-line package (SIP), a lead-on-substrate (LOS) multi-chip package, and a multi-chip module (MCM). Other equivalent packages known in the art are also applicable to the present invention.

Another configuration for the IC 302 is to directly attach the die or dies containing power converter circuit 314 and one or more function circuit 316 to an interconnect board or substrate using direct chip attachment (DCA) methods such as die attach and wire bonding, tape-automated bonding or flip-chip bonding. Also, positive AC input terminal 306 and negative AC input terminal 308 (i.e., power pins), are understood to be any appropriate terminal for electrical connection, such as a pin, a pad, a tab or a ball.

FIG. 3 illustrates a basic embodiment of one power converter circuit included within an IC 302 according to the present invention. IC 302 is connected to an external AC power source 304 at the positive AC input terminal (Vac+) 306 of IC 302 and at negative AC input terminal (Vac−) 308. The power applied to IC 302 is used to power other integrated circuitry within the IC.

As illustrated in FIG. 4, an IC 302 embodying the present invention includes power converter circuit 314 and powered function circuits 316. An AC power source 304 is connected to power converter circuit 314 at power converter positive AC input 312 and negative AC input 313 via interconnects from positive AC input terminal 306 and negative AC input terminal 308, respectively. Power converter circuit 314 is further connected to one or more powered function circuit 316 by Vdc+ power bus 317 and Vdc− power bus 318. These interconnect buses supply DC power to the one or more function circuit 316 within the IC 302. The function circuit 316 includes specific circuitry to perform complex functions within IC 302. Again, the function circuitry could be analog or digital, active or passive, and could comprise of one or more electronic components such as a diode, a capacitor, a bipolar junction transistor, or a MOS transistor, which collectively constitute either a processor, an operational amplifier, a charge pump, a buffer, an arithmetic logic unit (ALU), a memory, or any other circuit element within IC 302. Additionally, power converter circuit 314 may contain integrated circuitry that can be powered similarly to the other function circuits 316.

Although other power converter circuit embodiments or substitutions may be used in place of those shown and to be described, FIG. 5 depicts an exemplary embodiment of power converter circuit 314 that includes a transformer circuit 324 and a converter circuit 330. The AC power source 304 is connected to transformer circuit 324 at power converter positive AC input 312 and at power converter negative AC input 313 via interconnects from positive AC input terminal 306 and negative AC input terminal 308, respectively. Transformer circuit 324 is further connected to converter circuit 330 by V'ac+ power bus 327 and V'ac− power bus 328. These interconnect buses supply transformed AC power, such as a stepped down AC power signal, to converter circuit 330. Converter circuit 330 is further connected to supply DC power to the function circuits 316 via Vdc+ power bus 317 and Vdc− power bus 318. In one embodiment, converter circuit 330 is an AC/DC converter circuit. Hereinafter, the "transformed" AC power includes AC power signals that are stepped down, or alternatively, stepped up from the original AC power source signal.

In operation, transformer circuit 324 functions to step down, or step up, the amplitude of the AC power signal received from AC power source 304. For example, an AC power signal from power source 304 having an amplitude of 330 volts is transformed to a stepped down AC power signal with an amplitude in the range from 3.3 Vac to 1.0 Vac. Further, converter circuit 330 operates to convert the transformed AC power signal to a DC power signal for distribution to the one or more function circuits 316. For example, converter circuit 330 receives and converts the stepped down AC power signal, with amplitude in the range from 3.3 Vac to 1.0 Vac to a DC power signal having a DC level in the range from 3.3 Vdc to 1.0 Vdc.

Figure 6:
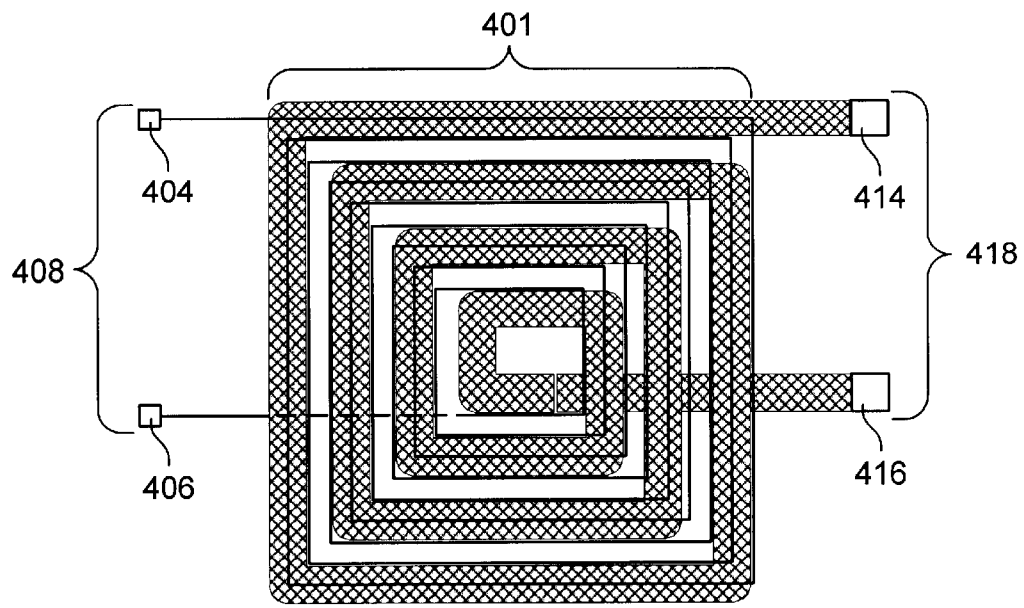
FIG. 6 is a schematic diagram of an exemplary transformer circuit.
Figure 7:
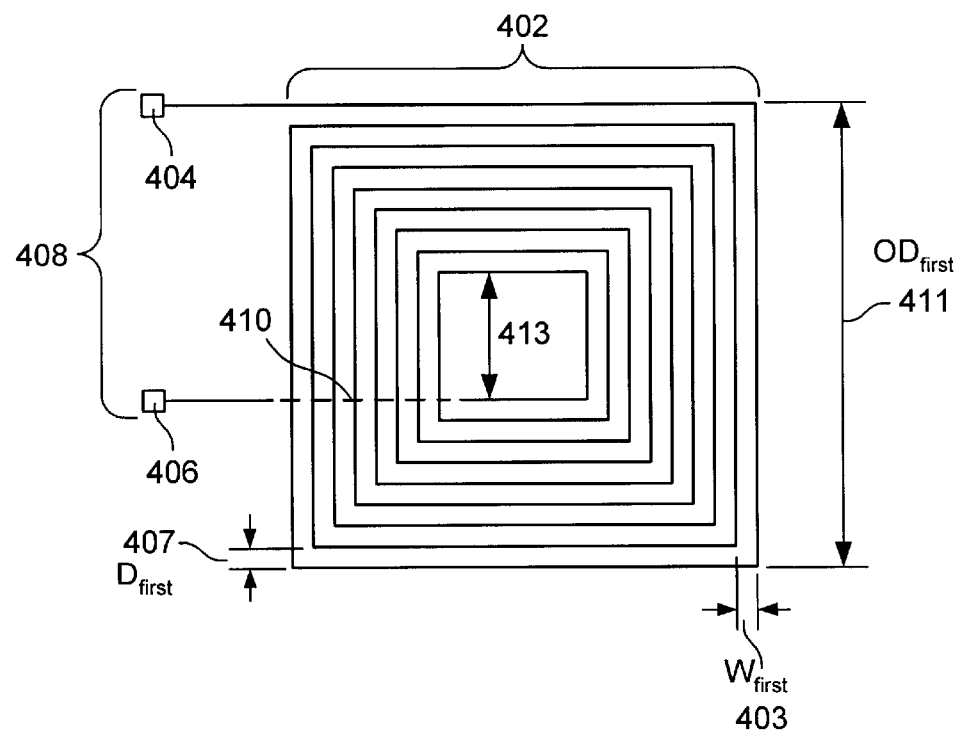
FIG. 7 is a schematic diagram for the first spiral of an exemplary transformer.
Figure 8:
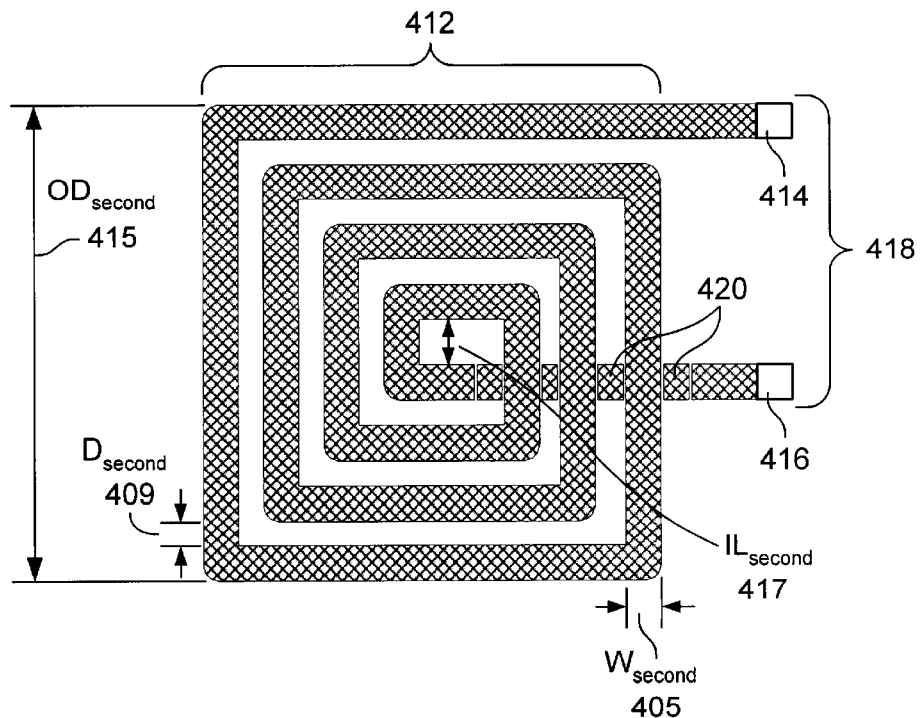
FIG. 8 is a schematic diagram for the second spiral of an exemplary transformer.

The transformer circuit 324 is shown in more detail in FIG. 6. Transformer circuit 324 is shown comprising transformer input 408, transformer output 418, and transformer 401. Transformer 401 further comprises two coils that include a first spiral 402 and a second spiral 412 as depicted in FIGS. 7 and 8, respectively. In an embodiment of the exemplary transformer circuit 324, FIGS. 6 and 7 show transformer input 408 having positive AC transformer circuit input (Vac+) 404 and negative AC transformer circuit input (Vac−) 406. Positive AC transformer circuit input (Vac+) 404 is associated with positive AC input terminal 306 and power converter positive AC input 312 of FIGS. 4 and 5. Likewise, negative AC transformer circuit input (Vac−) 406 is associated with negative AC input terminal 308 and power converter negative AC input 313. Transformer circuit inputs 404 and 406 are connected to the power source 304 to receive and to deliver the AC power signal to first spiral 402 via interconnects from the external AC power source 304.

FIGS. 7 and 8 show transformer output 418 having positive AC transformer circuit output (V'ac+) 414 and negative AC transformer circuit output (V'ac−) 416, which in turn, are coupled respectively to V'ac+ power bus 327 and V'ac− power bus 328, both of FIG. 5. Transformer output 418 functions to receive and to send a preferably stepped down, or stepped up, AC power signal from second spiral 412 to converter circuit 330 via V'ac+ power bus 327 and V'ac− power bus 328.

Again, in addition to transformer input 408 and transformer output 418, the transformer circuit 324 of FIG. 5 also includes representative transformer 401. This transformer comprises two coils wherein first spiral 402 is magnetically coupled to second spiral 412. First spiral 402 is the transformer's primary winding and second spiral 412 is the transformer's secondary winding. The degree of interconnectivity, or magnetic coupling, between the two coils is dependent on the structure of each coil. First spiral 402 is an elongated conductor, preferably a metal strip, having a user-defined thickness, width, and length, that is configured in an illustrative geometric layout shown in FIG. 7.

Furthermore, the conductor of the spiral resides on one or more surfaces. For example, the first portion of the conductor forming the spiral resides on one metal layer and another second portion 410 of the conductor traverses another metal layer. Second portion 410, as shown in FIG. 7, either completes the connection to external AC power source 304 of FIG. 5, or it contributes to the magnetically coupling of the transformer (i.e., is formed such that the conductor of first spiral 402 has two spirals residing on two surfaces where both contribute to the flux linkage generated by the first coil).

Second spiral 412 also is an elongated conductor, preferably a metal strip, having a user-defined thickness, width, and length, that is configured in an illustrative geometric layout shown in FIG. 8. Furthermore, the conductor of the spiral resides on one or more surfaces for the reasons enumerated above for first spiral 402, but the second spiral's second portion 420 is shown in FIG. 8. Lastly, although FIGS. 6, 7 and 8 embody a square planar spiral, other embodiments include circular, rectangular, or other geometric layout configurations.

Figure 9:
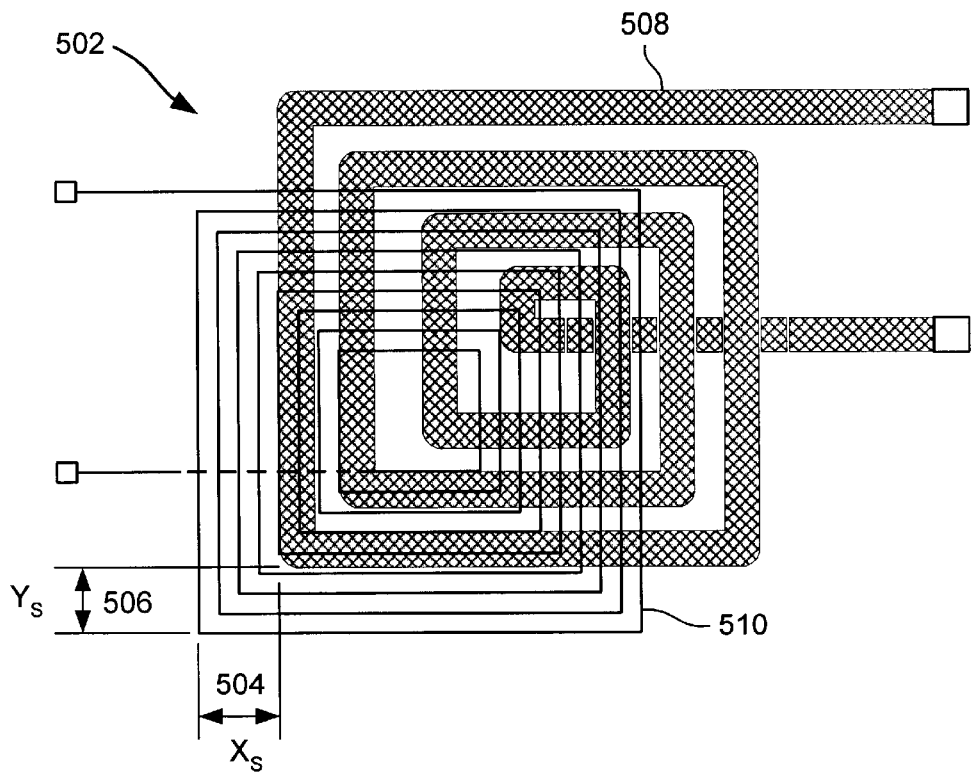
FIG. 9 is a schematic diagram representing first-to-second spiral offset.

The degree in which transformer circuit 324 operates to transform or step down the external AC power signal's amplitude is determined by the ratio of the number of turns of the second spiral 412 to the number of turns the first spiral 402. For example, the stepped down AC power signal V'ac is determined by the following equation (Equation 2):

$$V'ac = \kappa \left( \frac{N_{second}}{N_{first}} \right) Vac \qquad \text{(Equation 2)}$$

where Vac is the amplitude of the external AC power signal, $N_{second}$ is the number of turns in second spiral 412, $N_{first}$ is the number of turns in first spiral 402 and $\kappa$ is the mutual coupling coefficient. The coupling coefficient reflects transforming efficiency with respect to the offset between spirals as shown in FIG. 9. In one embodiment, the ratio of $N_{second}$ to $N_{first}$ is such that the transformer will step down 330 Vac to 3.3 Vac. Still, another embodiment includes the ratio of $N_{second}$ to $N_{first}$ such that the transformer will step down 330 Vac to 1.0 Vac, or even provide a stepped down AC power signal (V'ac) in the range from 3.0 Vac to 1.0 Vac.

The transforming efficiency of transformer circuit 502 in FIG. 9 is achieved when the magnetic coupling between first spiral 510 and second spiral 508 is maximized. In one embodiment, the transformer shown in FIG. 9 has first spiral 510 aligned on a layer above second spiral 508 such that there is offset between the centers of the two square spirals. For maximum magnetic coupling, first spiral 510 is vertically aligned with second spiral 508 such that there is substantially no offset. For example, the displacement in the X direction, Xs 504, is zero and the displacement in the Y direction, Ys 506, also is zero.

In another embodiment, the transformer shown in FIG. 6, the outside diameter of first spiral ($OD_{first}$) 411 is substantially the same as the outside diameter of second spiral ($OD_{second}$) 415 and the inside diameter of first spiral ($ID_{first}$) 413 is substantially the same as the inside diameter of second spiral ($ID_{second}$) 417. For larger values of $OD_{first}$ and $OD_{second}$, the more flux linkage will result, leading to larger values of self-inductance.

In still another embodiment, a transformer can have a non-unity ratio of $N_{second}$ to $N_{first}$ where the lateral spacing between the first spiraled-conductor $D_{first}$ 407, as well as the lateral spacing between the second spiraled-conductor $D_{second}$ 409, are of values such that the capacitive parasitics within each conductor is minimized. Yet in another embodiment, the width of the first spiraled-conductor $W_{first}$ 403 and the width of the second spiraled-conductor $W_{second}$ 405 are optimized to decrease the series resistance. For example, in a transformer where $W_{second}$ 405 is substantially larger than $W_{first}$ 403, the series resistance of second spiral 412 is substantially small enough to carry a current density larger than found in the first spiraled-conductor. An optimized $W_{second}$ 405 will be such that electromigration within the second spiraled-conductor is minimized for a given external AC power signal.

Figure 10:
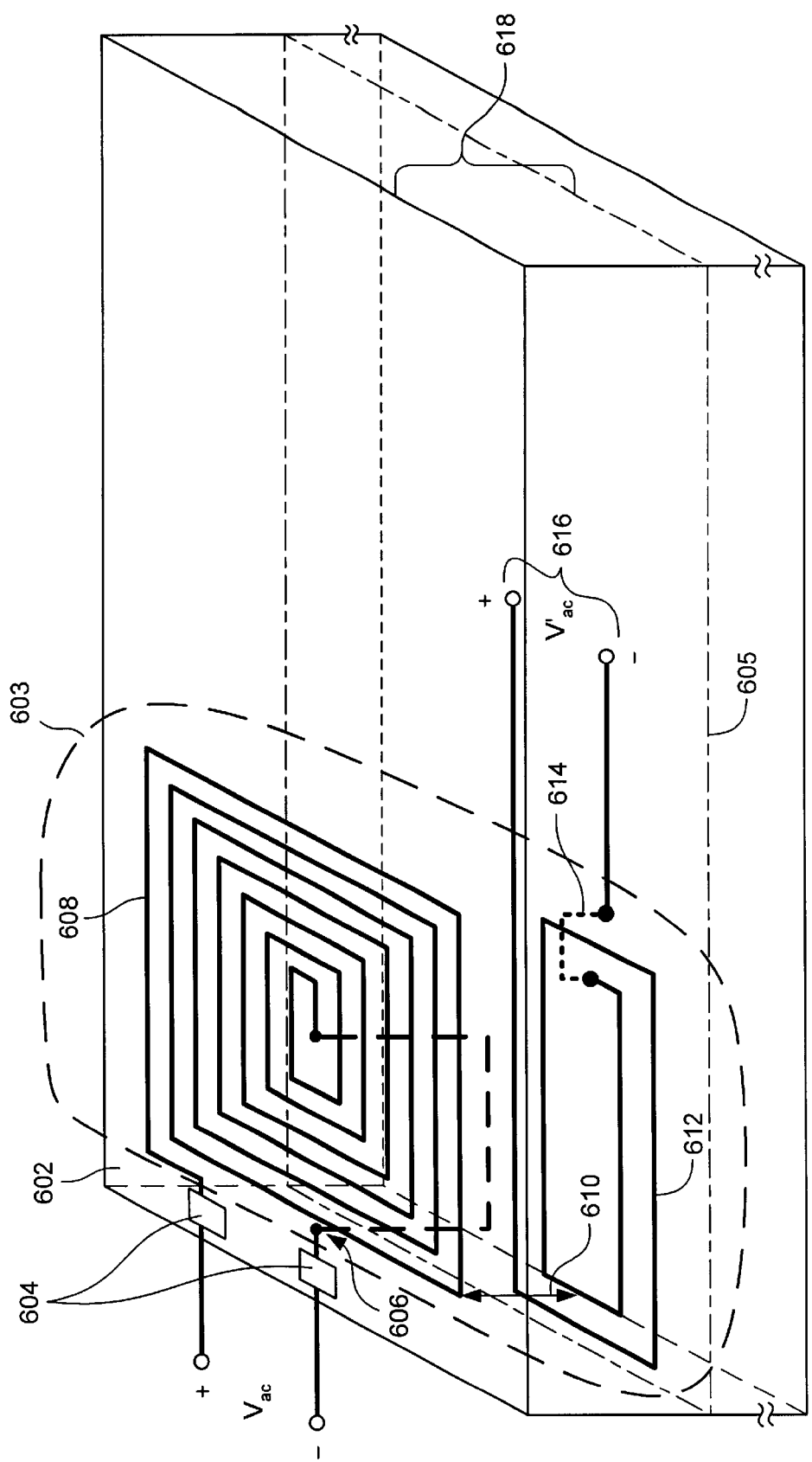
FIG. 10 is an illustration of one embodiment of the transformer circuit.
Figure 11:
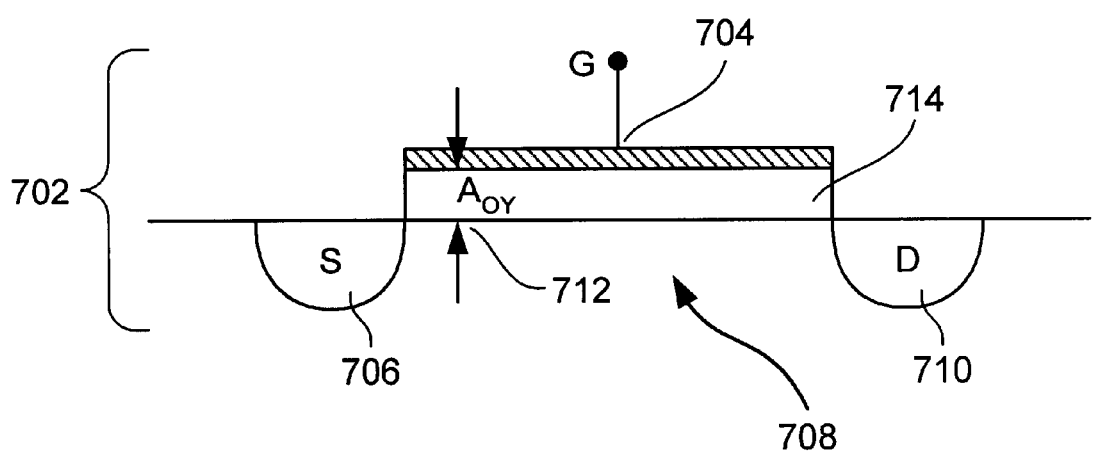
FIG. 11 is an illustration representing a MOS device.

As shown in FIG. 10, exemplary three-dimensional transformer 603 comprises transformer input 604, transformer output 616, first surface 602 supporting first spiral 608, second surface 605 supporting second spiral 612, second portion of first spiral 606, and second portion of second spiral 614. First spiral 608 and second spiral 612 are separated by insulating material layer 618, such as polysilicon. In one embodiment, the material layer is selected to have a breakdown voltage substantially greater than the breakdown voltage of an IC wherein one or more function circuits 316 includes a MOS device 702 as illustrated in FIG. 11. The MOS device comprises a gate 704, a source 706, a drain 710, a substrate 708, and a gate oxide 714. In another example, the material layer has a greater breakdown voltage of 1,500 volts compared to the 8 volts for the MOS device. In another embodiment, material layer thickness 610 is chosen to be substantially greater (e.g. 2 $\mu$m), than gate oxide thickness 712 of MOS device 702.

Other embodiments of a transformer circuit include an interleaved transformer where the two coils reside on the same plane and the second and first conductors are spiraled within each other. Another embodiment includes a transformer capable for supplying a reduced AC power signal that is 180 degrees out of phase with the external AC power signal for supplying a negative DC power signal. For example, a transformer might have the second spiral oriented such that it spirals in a direction opposite (e.g., counter clockwise) to a first spiral (e.g., clockwise). Still another embodiment includes a tapped transformer for supplying two reduced AC power signals for conversion, one into a positive DC power signal and another into a negative DC power signal.

Figure 12:
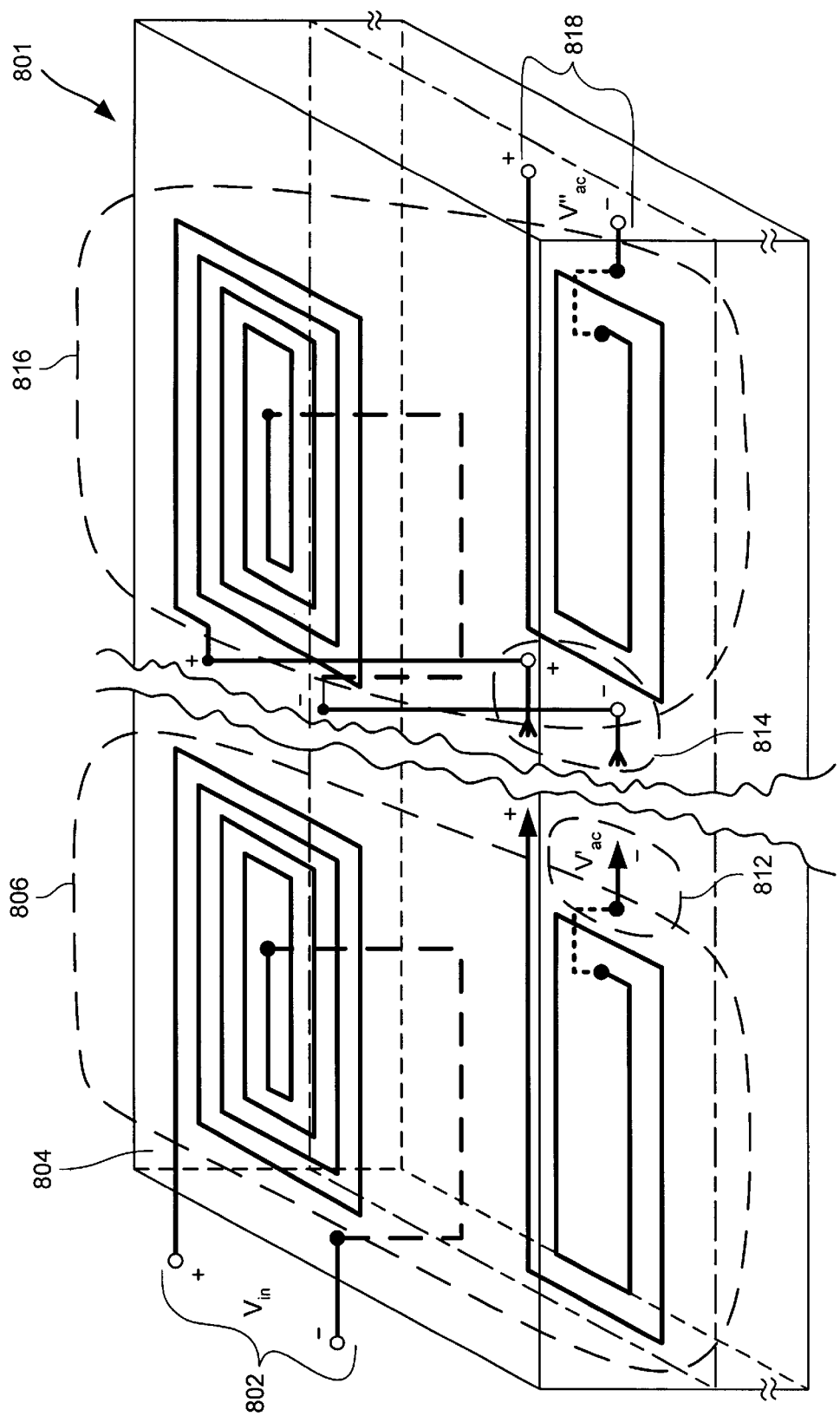
FIG. 12 is an illustration of another embodiment of the transformer circuit.
Figure 13:
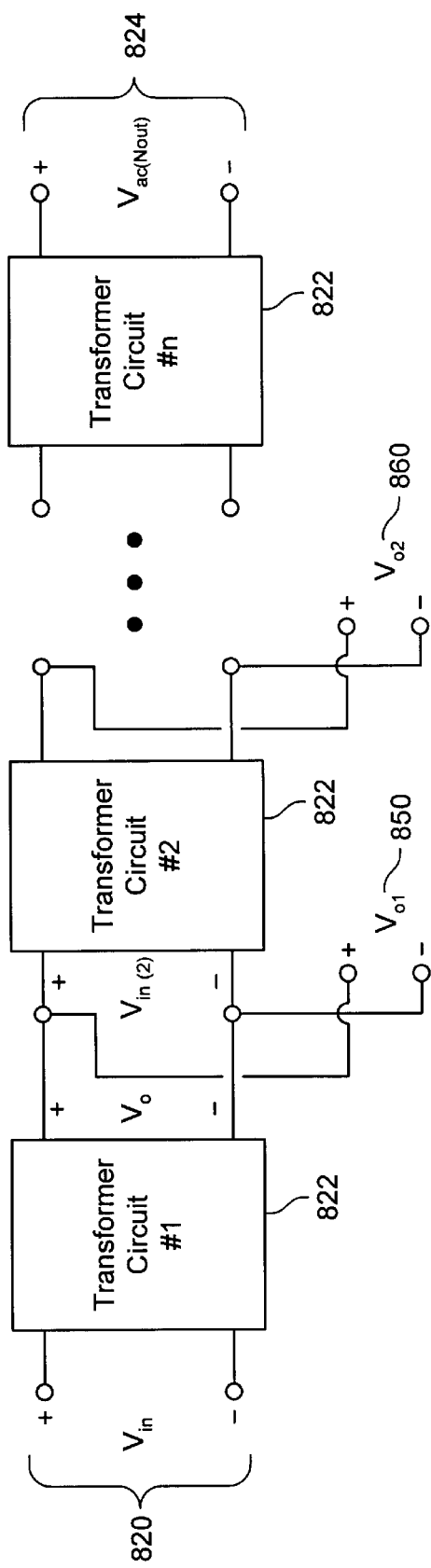
FIG. 13 is a block diagram of an exemplary transformer circuit comprising multiple transformers connected in series.

FIG. 12 shows a further embodiment of transformer circuit 324 of FIG. 5. FIG. 12 depicts transformer circuit 801 comprising two or more transformers connected in series. For example, first transformer 806 includes first transformer input 802 and first transformer output 812 and second transformer 816 includes second transformer input 814 and second transformer output 818. In this embodiment of transformer circuit 801, first transformer output 812 is coupled in series with second transformer input 814, wherein 814 receives a transformed AC power signal (V'ac) from first transformer 806 when an external AC power signal is applied to 802. Second transformer 816 operates to further reduce, for example, a stepped down AC power signal (V"ac) and to deliver the reduced AC power signal to converter circuit 330 in FIG. 5. For example, first transformer 806 steps down an external AC power signal of 330 Vac to 110 Vac and second transformer 816 further reduces the 110 Vac power signal to 1.1 Vac. FIG. 13 illustrates the exemplary transformer circuit 324 of FIG. 5 comprising transformer circuit output 820, transformer circuit input 824, and "n" number of transformers 822 coupled in series to supply an enhanced stepped down AC power signal Vac (Nout) to transformer circuit output 824. In another embodiment of transformer circuit 801, the output of each transformers 822 are adapted to tap off a respective AC power signal for providing varying magnitudes of DC power. Exemplary taps 850 and 860 illustrate the ability of the respective transformers to provide tapped off AC power signals.

Figure 14:
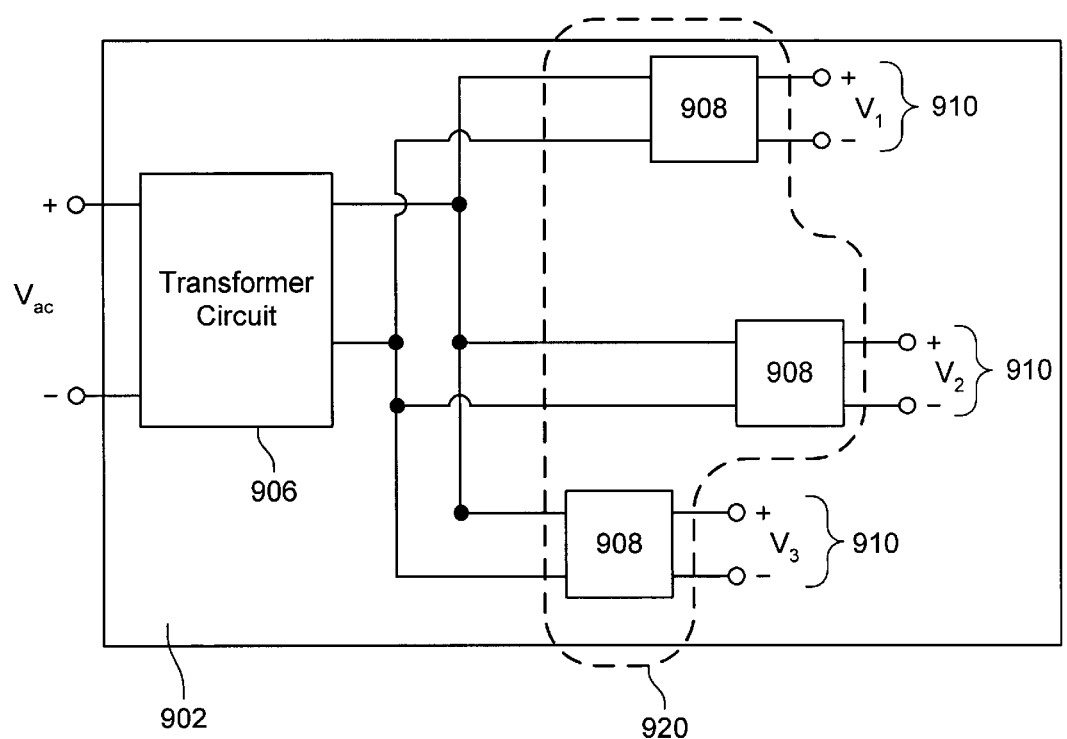
FIG. 14 is a block diagram depicting one embodiment of a converter circuit comprising multiple sub-converter circuits connected in parallel.

Another embodiment of power converter circuit 902 is shown in FIG. 14. In FIG. 14, converter circuit 920 includes one or more sub-converter circuit 908 distributed throughout IC 302 of FIG. 3. Each sub-converter circuit 908 is connected in parallel with the other sub-converter circuits to transformer circuit 906. Each sub-converter circuit 908 operates to receive, for example, a stepped down AC power signal (V'ac) and to convert it to a DC power signal (Vdc). Therefore, several DC power signals 910 are available to supply DC power to several associated function circuits.

Figure 15:
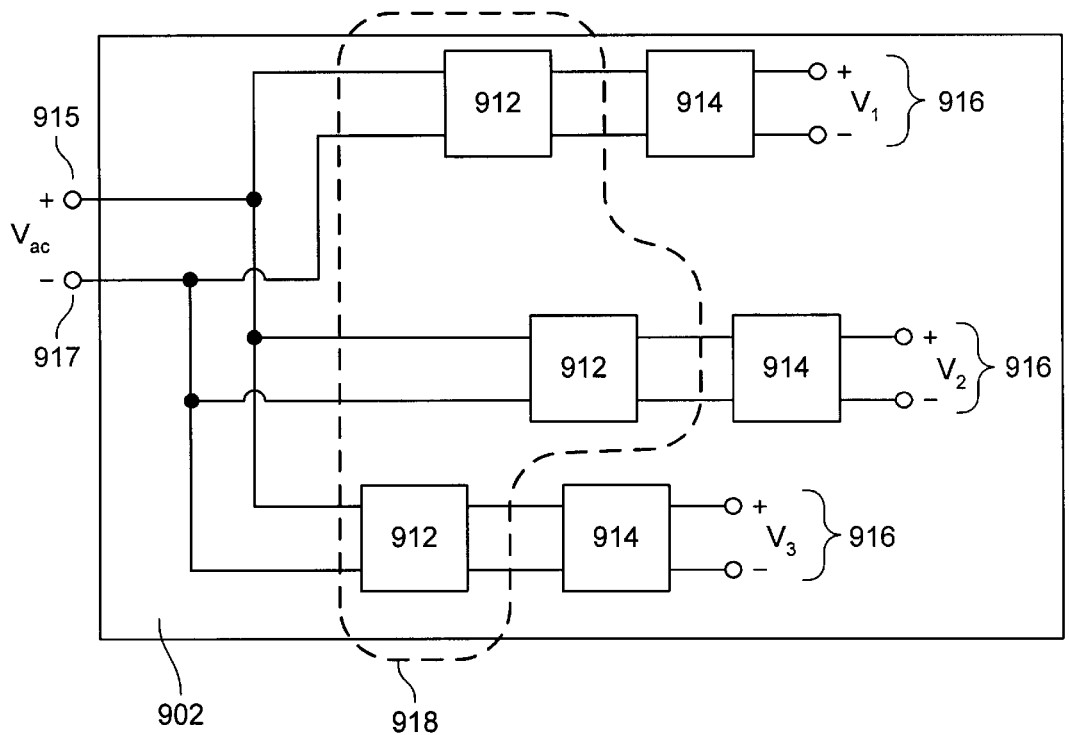
FIG. 15 is a block diagram depicting another embodiment of a converter circuit comprising multiple transformers and multiple sub-converter circuits connected in parallel.

FIG. 15 shows yet another embodiment of power converter circuit 902 wherein transformer circuit 918 comprises two or more transformers 912, connected in parallel, between a corresponding sub-converter circuit 914 and AC input terminals 915 and 917. Each transformer 912 is configured to supply, for example, a stepped down AC Power signal (V'ac) of same or varied amplitude. In turn, the sub-converter circuits 914 convert and supply DC power signals to various function circuits 316 distributed throughout IC 302 in FIG. 3.

Figure 16:
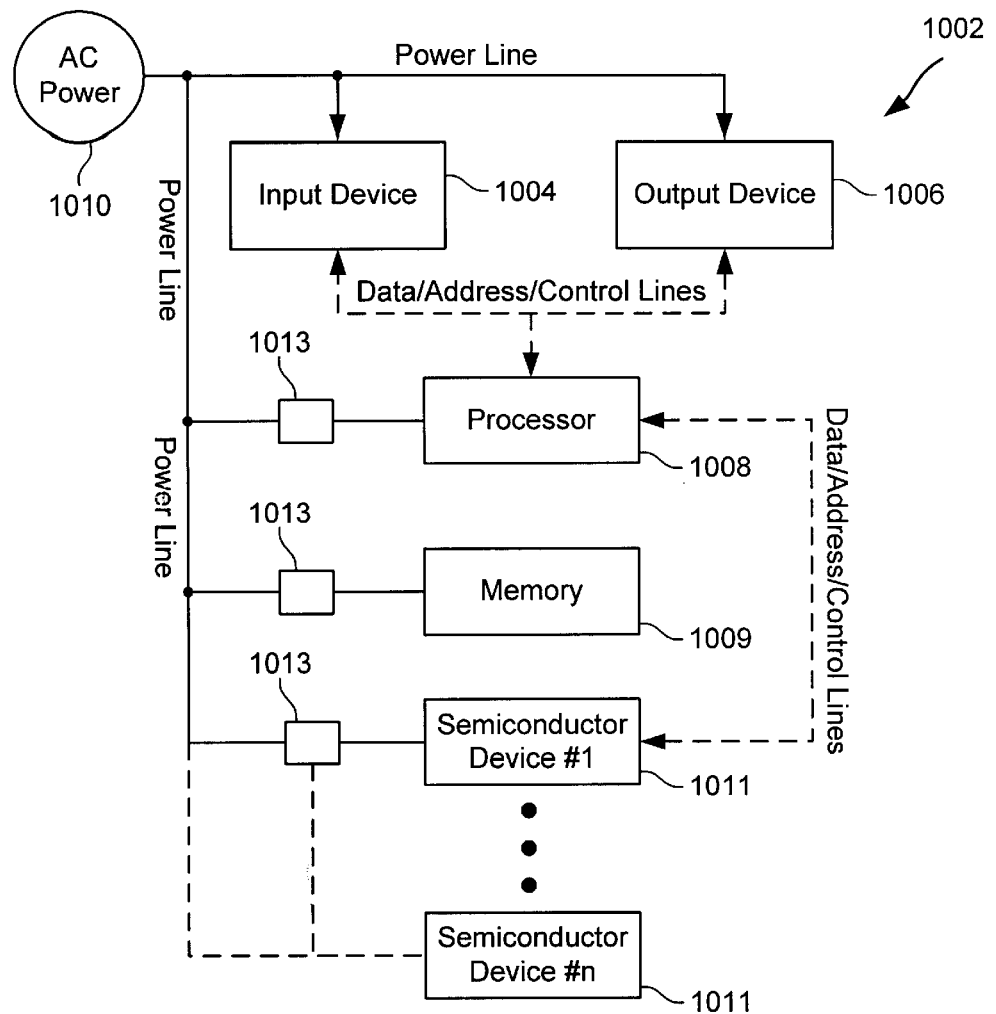
FIG. 16 is a block diagram of an exemplary computer system having ICs including the device of FIG. 3.

The inventive IC can be incorporated into computer system 1002 as shown in FIG. 16. Computer system 1002 includes input device 1004, such as a keyboard or mouse, output device 1006, such as a video or graphics display, and processor 1008 coupled to input device 1004, output device 1006, memory 1009 and a plurality of semiconductor devices 1011 for exchanging data, address and control information. The computer system 1002 also includes power converter circuit 1013 coupled between AC power source 1010 and at least one processor 1008, memory array 1009, and the plurality semiconductor devices 1011. In one embodiment, all ICs, or chips, (e.g., processor chip, memory chip, etc.) include a power converter circuit 1013 within the same IC. In another embodiment, power converter circuit 1013 is located in a separate chip coupled to at least one of the above devices or ICs. In yet another embodiment, the AC power source 1010 is also coupled one input device 1004 and output device 1006.

Figure 17:
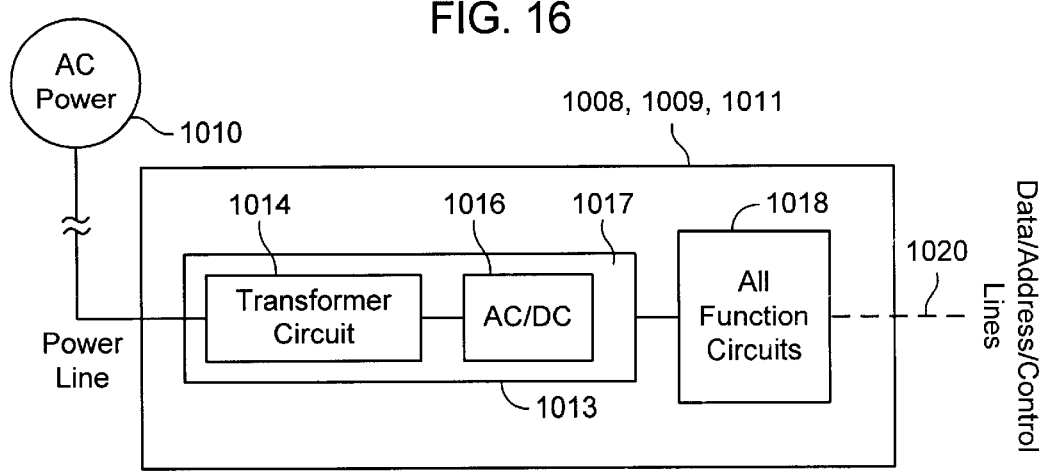
FIG. 17 is a block diagram of an IC having a power converter circuit.

As shown in FIG. 17, power converter circuit 1013 further comprises a transformer circuit 1014, as described in FIGS. 3 through 8, and AC/DC converter 1016 as described in FIGS. 3, 14 and 15. Transformer circuit 1014 receives and steps down an external AC power signal supplied by AC power source 1010 and AC/DC converter 1016 receives and converts, for example, a stepped down AC power signal into a DC power signal. ICs 1008, 1009, and 1011 also include DC power bus 1017 connected from AC/DC converter 1016 to the multiplicity of function circuits 1018 for supplying DC power. ICs 1008, 1009, and 1011 further include I/O lines 1020 coupled from function circuits 1018 to other devices or chips (not shown) for transporting data, address and control signals. Since a typical computer system is supplied with AC power anyway, the AC power for ICs 1008, 1009, and 1011 would be readily available. Where the frequency of the available power supply (such as 60 Hz) differs from the power used on the IC (such as 2.5 GHz), a frequency converter can be used.

In summary, a novel power converter circuit apparatus and method has been invented and is described herein. That power conversion approach reduces the number of power pins for a given IC design. Therefore, valuable pins are reserved for device functionality and I/O rather than power management. Furthermore, semiconductor chip layout and packaging are desirably less complex and costly.

The above description is illustrative and not restrictive. Many variations of the invention will become apparent to those of skill in the art upon review of this disclosure. For example, the ICs shown in the figures generally operate solely on DC power. However, the present invention also has utility in IC packages containing both AC-powered and DC-powered circuits. In such an IC, the AC-powered circuits could be powered with the AC power supplied at an input to the package or a stepped-down AC voltage stepped down from the input AC voltage. Furthermore, although frequencies in the gigahertz ("GHz") range are used as examples, other frequencies might work as well, or better if AC power at those other frequencies are already available or if those other frequencies bear a relationship with clock signal used in the IC. For example, if many of the circuits on an IC are clocked at 800 MHz, an 800 MHz AC power source might advantageously be used to supply both power and a clock. If a clock is synched to the AC supply, the AC supply might be less likely to interfere with the operation of circuits on the IC. The scope of the invention should, therefore, be determined not with reference to the above description, but instead should be determined with reference to the appended claims along with their full scope of equivalents.

What is claimed is:

1. An integrated circuit package comprising:
   one or more powered circuits within the integrated circuit package that manipulate signals or data when powered by DC power;
   a transformer circuit having a transformer circuit input and a transformer output, the transformer circuit input configured to receive an AC power signal originating from a power source external to the integrated circuit package and the transformer circuit output configured to supply a transformed AC power signal; and
   a converter circuit having a converter circuit input and a converter circuit output, the converter circuit input configured to receive the transformed AC power signal and the converter circuit output configured to supply the DC power to the powered circuits,
   wherein a signal-to-power pin ratio is optimized for the integrated circuit package.

2. In an integrated circuit package wherein power for powering circuits within the integrated circuit package is provided from a source external to the integrated circuit package via leads and wherein at least some signals are conveyed into and out of the integrated circuit package to and from the powered circuits via other leads, a power converter comprising:
   a transformer circuit formed within the integrated circuit package and having a transformer circuit input and a transformer output, the transformer circuit input configured to receive an AC power signal originating from the source and the transformer circuit output configured to supply a transformed AC power signal; and
   a converter circuit having a converter circuit input and a converter circuit output, the converter circuit input configured to receive the transformed AC power signal and the converter circuit output configured to supply DC power; and
   means for coupling, entirely within the integrated circuit package, the converter circuit output to the powered circuits of the integrated circuit package.

3. The power converter of claim 2, wherein the transformed AC power signal is a lower voltage than the received AC power signal and wherein the current used by the powered circuits is greater than the current conveyed via leads of the integrated circuit package.

4. The power converter of claim 2, wherein the power converter is an active circuit and is powered by one of the AC power signal and the DC power.

5. The power converter of claim 2, wherein the transformer circuit comprises at least two transformer circuits electrically coupled in series, the transformer circuits configured to supply a reduced transformed AC power signal to the converter circuit, wherein the output of each transformer circuit is configured to tap off the transformed AC power signal at each output.

6. The power converter of claim 2, wherein the converter circuit comprises at least two converter circuits electrically coupled in parallel with the transformer circuit, the converter circuits configured to supply at least two DC power signals to the powered circuits.

7. The power converter of claim 2, wherein the transformer circuit comprises at least two transformer circuits electrically coupled in parallel, the transformer circuits configured to supply a plurality of the transformed AC power signals to a plurality of converter circuits distributed throughout the powered circuits.

8. The power converter of claim 2, wherein the power converter and the powered circuits are on a single semiconductor die.

9. The power converter of claim 2, wherein the power converter is on a first semiconductor die and the powered circuits are on a second semiconductor die, both within the integrated circuit package.

10. A method for supplying power to one or more powered circuits within an integrated circuit package on a semiconductor substrate, the method comprising the steps of:
    applying an AC power signal to the integrated circuit package;
    receiving the AC power signal into a transformer circuit within the integrated circuit package using fewer leads than would be required to convey power at DC levels used by the powered circuits;
    stepping down the AC power signal to a transformed AC power signal, wherein the stepping down is performed within the integrated circuit package;
    converting the transformed AC power signal to a DC power signal; and
    supplying the DC power signal to the powered circuits.

11. A method of reducing the amount of current transmitted through power pins of an integrated circuit package, while supplying and maintaining a given amount of power to powered circuits contained on a semiconductor substrate within the integrated circuit package, the method comprising the steps of:
    applying an AC power signal to first ends of the power pins, the AC power signal having an amplitude that is greater than a voltage value of a DC power signal that provides power to the powered circuits;
    connecting second ends of the power pins to a primary winding of a step-down transformer formed on the semiconductor substrate, to transform the AC power signal to a stepped-down AC signal provided at a secondary winding of the transformer; and
    coupling the stepped-down AC signal to a rectifier formed on the semiconductor substrate of the integrated circuit, to rectify the stepped-down AC signal and provide the DC power signal.

12. The method of claim 11, wherein the primary winding of the transformer is formed in the shape of a spiral in a first metal layer of the semiconductor substrate and the secondary winding of the transformer is formed in the shape of a spiral in a second metal layer of the semiconductor substrate.

* * * * *